(12) United States Patent
Sumi (10) Patent No.: US 11,658,054 B2
(45) Date of Patent: May 23, 2023

(54) SUBSTRATE PROCESSING APPARATUS AND SUBSTRATE PROCESSING SYSTEM

(71) Applicant: SCREEN Holdings Co., Ltd., Kyoto (JP)

(72) Inventor: Noritake Sumi, Kyoto (JP)

(73) Assignee: SCREEN Holdings Co., Ltd.

(*) Notice: Subject to any disclaimer, the term of this patent is extended or adjusted under 35 U.S.C. 154(b) by 103 days.

(21) Appl. No.: 17/152,833

(22) Filed: Jan. 20, 2021

(65) Prior Publication Data

US 2021/0242058 A1    Aug. 5, 2021

(30) Foreign Application Priority Data

Jan. 31, 2020   (JP) .............................. JP2020-015214

(51) Int. Cl.
*H01L 21/677* (2006.01)
*H01L 21/673* (2006.01)

(52) U.S. Cl.
CPC .. *H01L 21/67772* (2013.01); *H01L 21/67373* (2013.01); *H01L 21/67742* (2013.01)

(58) Field of Classification Search
CPC .................... H01L 21/67373; H01L 21/67772
See application file for complete search history.

(56) References Cited

U.S. PATENT DOCUMENTS

2004/0040660 A1   3/2004  Biberger et al. ......... 156/345.31
2004/0194817 A1  10/2004  Pope et al. ..................... 134/148
2011/0000512 A1   1/2011  Toshima et al. ................. 134/34
2011/0247662 A1  10/2011  Kamikawa ..................... 134/105
2013/0029282 A1   1/2013  Park et al. ..................... 432/198

FOREIGN PATENT DOCUMENTS

| CN | 102237260 B | 7/2015 | |
|---|---|---|---|
| CN | 109585333 A | * 4/2019 | ....... H01L 21/67023 |
| JP | 2011-222696 A | 11/2011 | |
| JP | 2012-119391 A | 6/2012 | |
| JP | 2013-033964 A | 2/2013 | |
| JP | 2015-039040 A | 2/2015 | |

(Continued)

OTHER PUBLICATIONS

Office Action dated May 24, 2022 for corresponding Korean Patent Application No. 10-2021-0009346.

(Continued)

*Primary Examiner* — Kaitlin S Joerger
(74) *Attorney, Agent, or Firm* — Ostrolenk Faber LLP (57) ABSTRACT

A substrate processing system includes a processing container body having an opening, a lid which closes an opening, a mover for relatively moving the lid with respect to the opening to open and close the opening, and a lock mechanism which locks the lid to the processing container body. The lock mechanism includes an arm member and a locking member. The arm member is provided on one of the processing container body and the lid and extends toward the other when the processing container body is located at a position where the lid is separated from the processing container body. The locking member restricts a displacement of the arm member by being engaged with a part of the arm member. This part is located beyond the gap space when the lid is at the separated position.

9 Claims, 7 Drawing Sheets

(56) References Cited

FOREIGN PATENT DOCUMENTS

| JP | 2017-228789 A | | 12/2017 | | |
|---|---|---|---|---|---|
| JP | UP 2018-163992 A | | 10/2018 | | |
| JP | 2019-067863 A | | 4/2019 | | |
| JP | 6906416 B2 | * | 7/2021 | ....... | H01L 21/67023 |
| KR | 10-2011-0002419 A | | 1/2011 | | |
| KR | 10-2013-0014312 A | | 2/2013 | | |
| KR | 10-2019-0003068 A | | 1/2019 | | |
| KR | 20210015056 A | * | 2/2021 | ........... | H01L 21/677 |
| TW | 559879 B | | 11/2003 | | |
| WO | WO 2004/090339 A2 | | 10/2004 | | |

OTHER PUBLICATIONS

Notice of Allowance dated Feb. 11, 2022 for corresponding Taiwanese Application No. 110101780.
Notice of Allowance dated Feb. 28, 2023 for corresponding Korean Patent Application No. 10-2021-0009346.

* cited by examiner

SUBSTRATE PROCESSING APPARATUS AND SUBSTRATE PROCESSING SYSTEM

CROSS REFERENCE TO RELATED APPLICATION

The disclosure of Japanese Patent Application No. 2020-015214 filed on Jan. 31, 2020 including specification, drawings and claims is incorporated herein by reference in its entirety.

BACKGROUND OF THE INVENTION

1. Field of the Invention

This invention relates to a substrate processing apparatus for processing a substrate in a processing chamber, particularly to a substrate processing apparatus for processing under a high pressure and a substrate processing system including the same.

2. Description of the Related Art

A processing for various substrates such as semiconductor substrates and glass substrates for display device includes the processing of the substrates by various processing fluids. Such a processing may be performed in an airtight processing container for the purpose of efficiently using the processing fluid and preventing dissipation to outside. In this case, the processing container is provided with an opening for loading/unloading the substrate and a lid for ensuring the airtightness of an internal space by closing the opening. Particularly, if the processing is performed under a high-pressure condition with respect to an ambient atmosphere, a lock mechanism for reliably fixing a processing container body and the lid is necessary to maintain airtightness and prevent the lid from being opened by an internal pressure.

For example, in a processing device described in JP 2015-039040A (patent literature 1), a substrate (wafer) to be processed is loaded into a processing container while being placed on a holder in the form of a flat plate. By mounting a lock plate for pressing a lid body on the processing container after an opening of the processing container is closed by the lid body which is integrated with the holder, the protrusion of the lid body is mechanically suppressed. Further, in a substrate processing apparatus described in JP 2013-033964A (patent literature 2), a door swingably mounted on a housing body closes an opening and is locked by being engaged with a pressure plate, whereby airtightness in a housing is maintained.

In the case of applying such a processing apparatus including the processing container, for example, to a process for cleaning a substrate, it is necessary to prevent the substrate loaded into or unloaded from the processing container from being contaminated with dust generated due to the operation of a mechanical component. However, both of the lock mechanisms of the above conventional art are structured such that members rub against each other near the opening of the processing container. Thus, fine powder produced by rubbing between the members possibly scatters around or adheres to a conveyance path for the substrate and the opening as particles to cause the contamination of the substrate.

SUMMARY OF THE INVENTION

This invention was developed in view of the above problem and an object thereof is to provide a structure capable of reliably locking a lid to a container body while preventing dust generated by the rubbing of members from contaminating a substrate in a substrate processing apparatus for processing the substrate in a processing container.

To achieve the above object, one aspect of this invention includes a processing container body which has an internal space capable of accommodating a substrate and an opening communicating with the internal space for passage of the substrate, a lid which closes the opening, a mover which relatively moves the lid with respect to the opening to open and close the opening, and a lock mechanism which locks the lid to the processing container body, wherein the mover changes a relative position of the lid with respect to the processing container body between a closed position and a separated position. Here, the closed position is a position where the lid is proximate to the processing container body and closes the opening, and the separated position is a position where the lid is separated from the opening in a direction opposite to the internal space with a gap space defined between the lid and the opening for allowing passage of the substrate being conveyed into the internal space. The lock mechanism includes an arm member provided on one of the processing container body and the lid and extending toward the other, and a locking member for restricting a displacement of the arm member by being engaged with the arm member when the lid is at the closed position. A tip of the arm member extends toward a side of the other beyond the gap space when the lid is at the separated position, and the locking member is engaged with a part of the arm member. This part is located beyond the gap space when the lid is at the separated position.

In the invention, the "closed position" and the "separated position" of the lid are relative positions with respect to the processing container body. To avoid cumbersomeness, description that these positions are "relative positions with respect to the processing container body" may be omitted. Similarly, "movement" of the member in the following description indicates "relative movement" with respect to the other members unless particularly mentioned and do not limit a subject of the movement in an actual space.

In the invention configured as described above, the processing container body and the lid are locked by the engagement of the arm member and the locking member provided in the lock mechanism. There is a possibility of dust generation due to rubbing between the arm member and the locking member, but the influence thereof does not reach the gap space where the substrate is conveyed. The reason for that is as follows.

In this invention, the lid moves with respect to the processing container body between the closed position for closing the opening of the processing container body and the separated position for forming the gap space, through which the substrate can pass, between the lid and a processing container. The arm member of the lock mechanism extends from one of the processing container body and the lid toward the other side, and the tip thereof reaches the other side beyond the gap space even if the lid is at the separated position.

If a process of moving the lid to the closed position from this state is considered, an interval between the processing container body and the lid gradually becomes smaller to narrow the gap space. Along with this, a part engaged with the locking member out of the arm member (hereinafter, referred to as an "engaged part") moves in a direction away from the gap space. Then, in the process of moving the lid between the separated position and the closed position, the engaged part of the arm member is constantly located at a position separated from the gap space. Particularly, the engagement of the arm member and the locking member is realized at a position largely separated from the gap space and the opening of the processing container body.

As just described, in the entire moving process between the separated position and the closed position, the arm member and the locking member are engaged on a side closer to the other side than the gap space. Thus, even if particles are produced by the rubbing of the both, a probability of entrance of these particles into a conveyance path for the substrate and the internal space of the processing container body is largely reduced. Further, the conveyance of particles produced in the engaged part and adhering to around the engaged part to the gap space according to a movement of the arm member is also avoided when the lid moves from the closed position to the separated position.

As described above, in the invention, when the lid is at the closing position for closing the opening of the processing container body, the arm member and the locking member of the lock mechanism are mechanically engaged, whereby the lid and the processing container body can be firmly joined and reliably locked. In this way, the airtightness of the internal space can be maintained and the leakage of contents can be prevented. Further, even if the lid is separated from the processing container body, the entrance of particles produced by the rubbing of the arm member and the locking member into the gap space is prevented and the contamination of the substrate can also be prevented.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

DETAILED DESCRIPTION OF THE PREFERRED EMBODIMENTS

Figure 1:
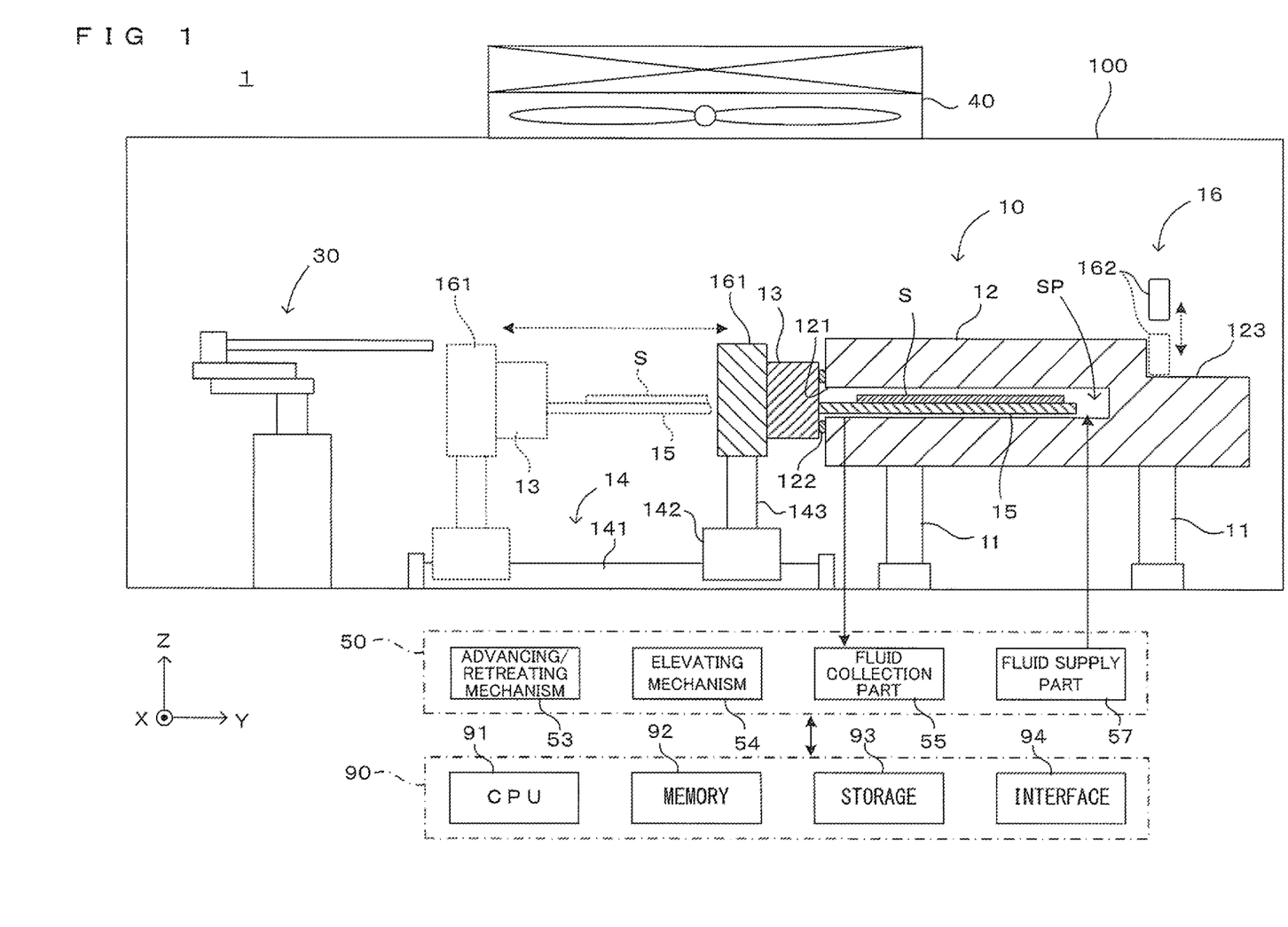
FIG. 1 is a diagram showing a schematic configuration of an embodiment of a substrate processing system.

FIG. 1 is a diagram showing a schematic configuration of an embodiment of a substrate processing system including a substrate processing apparatus according to the disclosure. This substrate processing system 1 is a processing system for processing surfaces of various substrates such as semiconductor substrates using a supercritical fluid. An XYZ orthogonal coordinate system is set as shown in FIG. 1 in order to uniformly indicate the directions in the following drawings. Here, the XY plane is a horizontal plane, and the Z direction represents the vertical direction. More specifically, the (−Z) direction represents the vertically downward direction.

Here, various substrates such as a semiconductor wafer, a photomask glass substrate, a liquid crystal display glass substrate, a plasma display glass substrate, a field emission display (FED) substrate, an optical disc substrate, a magnetic disk substrate, a magneto-optical disk substrate and the like may be applied as the "substrate" in the embodiment. In the following, a substrate processing system mainly used for processing semiconductor wafers will be described as an example with reference to the drawings. However, the same may be applied to the processing of the various substrates exemplified above. Further, the substrates having various shapes can be applied to the processing.

The substrate processing system 1 includes a processing unit 10 and a transfer unit 30 installed in a clean room 100. The processing unit 10 is an execution subject of a supercritical drying process. The transfer unit 30 receives an unprocessed substrate S conveyed by an unillustrated external conveyor device, loads the substrate S into the processing unit 10 and transfers the processed substrate S from the processing unit 10 to the external conveyor device. Further, the substrate processing system 1 includes a supply unit 50 and a control unit 90 installed inside or outside the clean room 100. The supply unit 50 supplies chemical substances and power necessary for the process to the processing unit 10 and the transfer unit 30.

A known articulated robot can be, for example, used as the transfer unit 30. Various other structures are known as such robots for transferring a substrate between processing units, and an appropriate one can be selected from those and used. Thus, the structure of the transfer unit 30 is not described. Further, a fan filter unit (FFU) 40 is installed on a ceiling part of the clean room 100, and a clean downflow is supplied from above the processing unit 10.

The control unit 90 controls each part of the apparatus to realize predetermined processing. For this purpose, the control unit 90 includes a CPU 91 for executing various control programs, a memory 92 for temporarily storing processing data, a storage 93 for storing control programs to be executed by the CPU 91, and an interface 94 for exchanging information with users and external apparatuses. Operations of the apparatus to be described later are realized by the CPU 91 executing the control programs written in advance in the storage 93 and causing each part of the apparatus to perform a predetermined operation.

The processing unit 10 is structured such that a processing chamber 12 is mounted on support legs 11. The processing chamber 12 is configured by combining several metal blocks and the inside thereof is hollow and constitutes a processing space SP. The substrate S to be processed is loaded into the processing space SP and processed. A slit-like opening 121 elongated in the X direction is formed in a side surface on a (−Y) side of the processing chamber 12, and an outside space communicates with the processing space SP via the opening 121.

A lid member 13 is provided in the side surface on the (−Y) side of the processing chamber 12 to close the opening 121. A processing container is configured by the lid member 13 closing the opening 121 of the processing chamber 12, and the substrate S can be processed under a high pressure in the internal processing space SP. A support tray 15 in the form of a flat plate is mounted in a horizontal posture on a side surface on a (+Y) side of the lid member 13. An upper surface of the support tray 15 serves as a support surface on which the substrate S is placeable. The transfer unit 30 places the unprocessed substrate S on the upper surface of the support tray 15 and unloads the processed substrate S on the support tray 15.

The lid member 13 is supported horizontally movably in the Y direction by a support part 14 via an arm member 161. More specifically, the lid member 13 is mounted on the arm member 161 constituting a part of a lock mechanism 16 to be described later, and the arm member 161 is supported by the support part 14. The support part 14 includes a guide rail 141 disposed along the Y direction on a floor surface of the clean room 100 and a slider 142 engaged with the guide rail 141 movably in the Y direction. A support leg 143 is provided on the slider 142, and the arm member 161 is supported by the support leg 143.

The lid member 13 may be moved to advance and retreat with respect to the processing chamber 12 by an advancing and retreating mechanism 53 provided in the supply unit 50. Specifically, the advancing and retreating mechanism 53 has a linear motion mechanism, such as a linear motor, a linear motion guide, a ball screw mechanism, a solenoid and an air cylinder. Such a linear motion mechanism moves the slider 142 of the support part 14 along with the guide rail 141 in the Y direction, thereby the lid member 13 moves in Y direction. The advancing and retreating mechanism 53 operates in response to a control command from the control unit 90.

By moving the lid member 13 in the (−Y) direction, as shown by dotted lines in FIG. 1, the support tray 15 is pulled out from the processing space SP through the opening 121 and then, the support tray 15 can be accessed from the outside. That is, the substrate S can be placed on the support tray 15, and the substrate S placed on the support tray 15 can be taken out. On the other hand, by moving the lid member 13 in the (+Y) direction as shown by solid lines in FIG. 1, the support tray 15 is housed in the processing space SP. When the substrate S is placed on the support tray 15, the substrate S is carried into the processing space SP together with the support tray 15.

By moving the lid member 13 in the (+Y) direction and closing the opening 121, the processing space SP is sealed. A seal member 122 is provided between the side surface of the lid member 13 on the (+Y) side and the side surface of the processing chamber 12 on the (−Y) side to maintain the airtight state of the processing space SP. Further, the lid member 13 is fixed to the processing chamber 12 by a lock mechanism which will be described later. In this way, the processing is executed on the substrate S in the processing space SP while the airtight state of the processing space SP is ensured.

In this embodiment, a fluid supply part 57 provided in the supply unit 50 supplies a fluid of a substance that may be used for supercritical processing, such as carbon dioxide, to the processing unit 10 in a gas state or a liquid state. Carbon dioxide is in a supercritical state at a relatively low temperature and low pressure, and has a property of well dissolving an organic solvent often used for substrate processing. In this respect, carbon dioxide is a suitable chemical substance for the supercritical drying processing.

The fluid is filled into the processing space SP. When appropriate temperature and pressure are reached in the processing space SP, the fluid enters a supercritical state. In this way, the substrate S is processed by the supercritical fluid in the processing chamber 12. The supply unit 50 is provided with a fluid collection part 55, and the fluid after the process is collected by the fluid collection part 55. A fluid supply part 57 and the fluid collection part 55 are controlled by the control unit 90.

In the substrate processing system 1 having main components as described above, a supercritical drying process, i.e. a process for drying the substrate S using the supercritical fluid, is performed for the substrate S conveyed in a state wet with a processing liquid. In this process, the processing liquid adhering to the substrate S is replaced by the supercritical fluid having a very low surface tension, and the substrate S is dried by the supercritical fluid being directly sublimated without via a liquid phase. Thus, particularly in the drying of a substrate having a fine pattern formed on a surface, a pattern collapse occurring by the action of a surface tension of a liquid on a gas-liquid interface can be prevented. Since such a supercritical drying process is known, the processing process is not described in detail here.

During the process, the processing space SP in the processing chamber 12 is brought to a high pressure. Thus, a lock mechanism for firmly joining the processing chamber 12 and the lid member 13 is necessary to prevent the leakage of the high-pressure fluid, properly maintain an internal pressure and prevent the detachment of the lid member 13 due to the internal pressure. The structure of the lock mechanism 16 in this embodiment is described below with reference to FIGS. 2 to 5.

Figure 2:
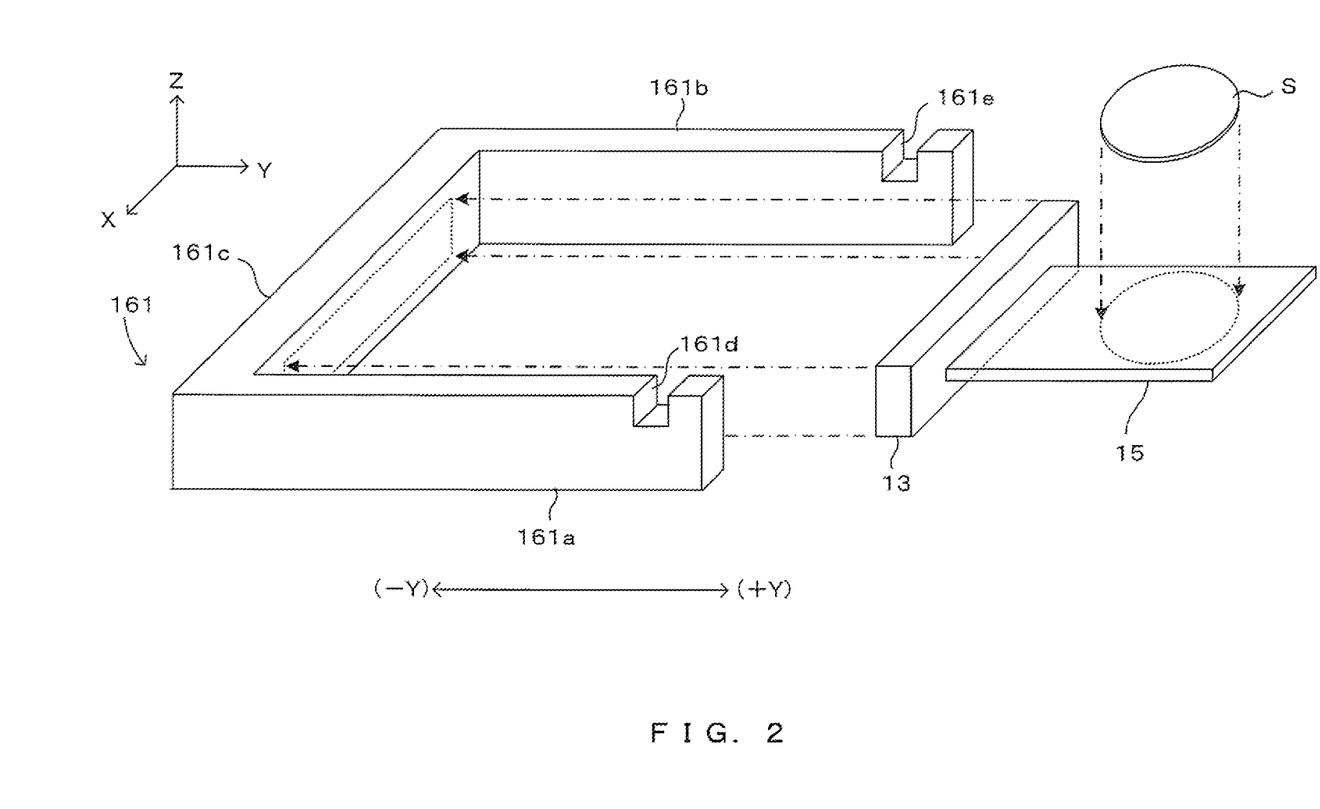
FIG. 2 is an exploded perspective view showing the configuration of the lock mechanism.
Figure 3:
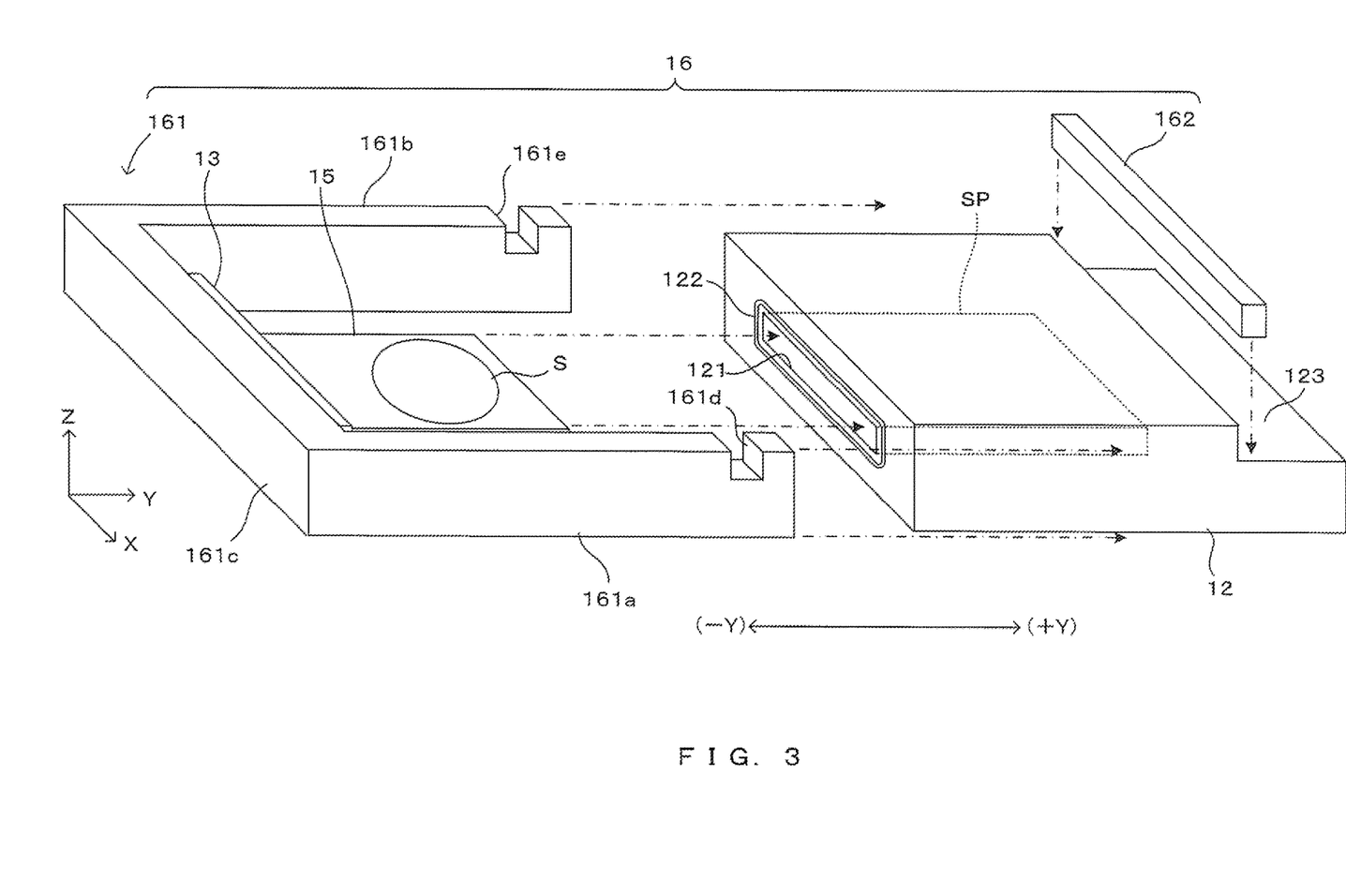
FIG. 3 is an exploded perspective view showing the configuration of the lock mechanism.
Figure 4:
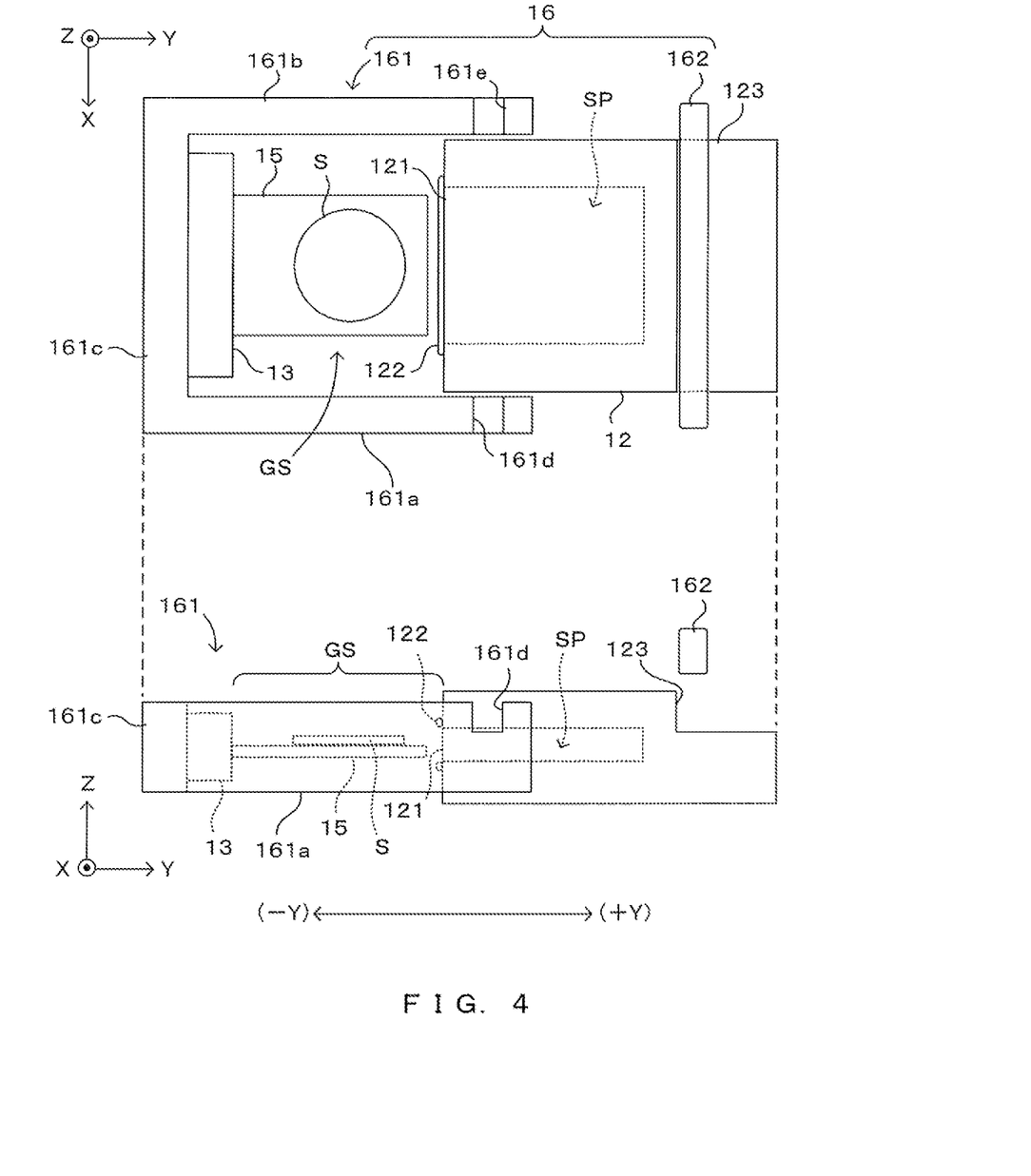
FIG. 4 is a diagram showing the operation of the lock mechanism.
Figure 5:
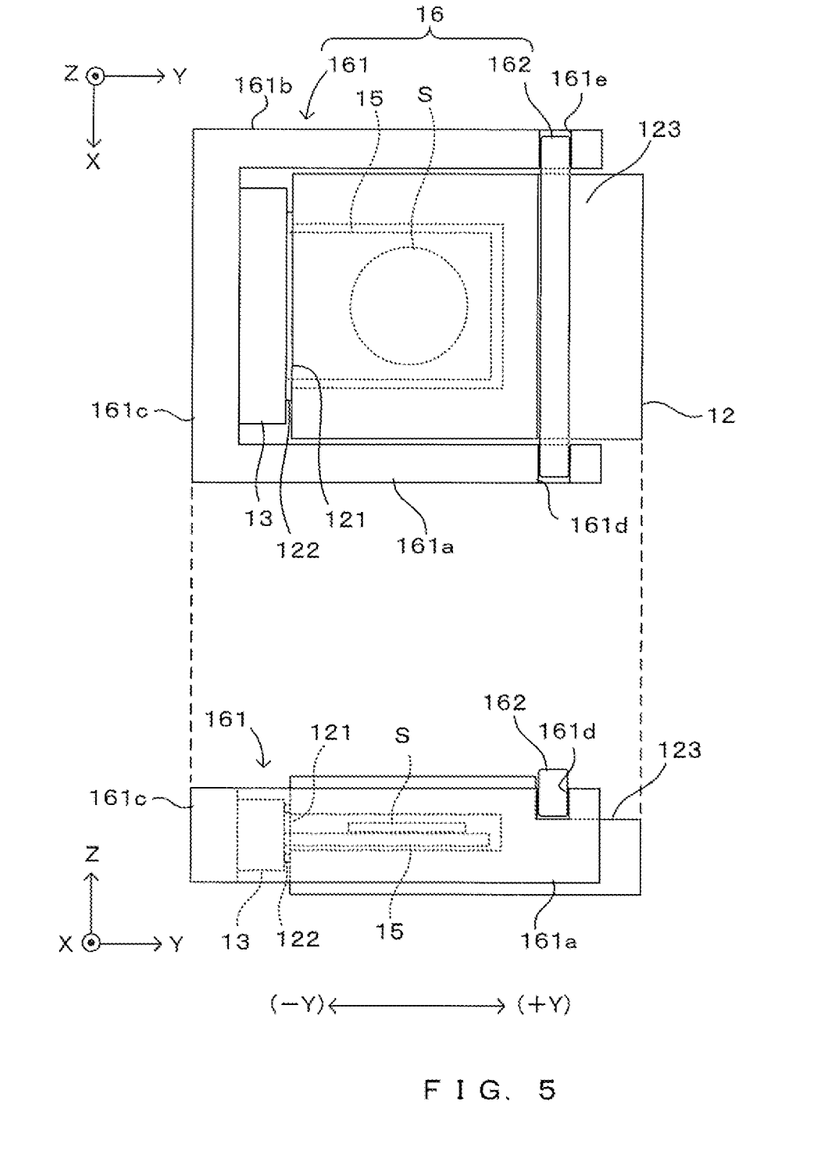
FIG. 5 is a diagram showing the operation of the lock mechanism.

FIGS. 2 and 3 are exploded perspective views showing the configuration of the lock mechanism. Further, FIGS. 4 and 5 are diagrams showing the operation of the lock mechanism. As shown in FIGS. 2 and 3, the lock mechanism 16 in this embodiment includes the arm member 161 and a locking member 162. First, the structure of the arm member 161 is described with reference to FIG. 2.

The arm member 161 is a metal member having a substantially U-shape or horseshoe shape. As shown in FIG. 2, the arm member 161 includes a pair of arms 161a, 161b extending in the Y direction and a connecting part 161c extending in the X direction to connect (−Y) side end parts of these arms. The connecting part 161c has a length longer than a length in the X direction of the lid member 13, and the lid member 13 is fixed to a side surface thereof on the (+Y) side. Specifically, the arm member 161 and the lid member 13 are mechanically integrated.

The arms 161a, 161b extend in the (+Y) direction from the connecting part 161c on sides outward of the lid member 13 in the X direction. Cut parts 161d, 161e formed by partially cutting arm upper end parts are provided near the tips of the respective arms 161a, 161b.

As shown in FIG. 3, an integrated structure of the lid member 13 and the arm member 161 as described above is combined with the processing chamber 12. This structure is movable in the Y direction by the operation of an advancing/retreating mechanism 53. If the structure moves in the (+Y) direction, the support tray 15 mounted on the lid member 13 and the substrate S placed on the upper surface of the support tray 15 enter the processing space SP inside the processing chamber 12 through the opening 121 provided in the side surface on the (−Y) side of the processing chamber 12. Finally, the lid member 13 comes into contact with a seal member 122 provided around the opening 121 and the structure moves up to a position for closing the opening 121, whereby the support tray 15 and the substrate S are sealed in the processing space SP.

On the other hand, the both arms 161a, 161b of the arm member 161 move in the (+Y) direction on sides outward of the both side surfaces in the X direction of the processing chamber 12. An upper part of a (+Y) side end part of the processing chamber 12 is cut, and the locking member 162 is arranged above this cut part 123. Although not shown in FIG. 3, the locking member 162 is supported movably upward and downward by an elevating mechanism 54 (FIG. 1) such as a linear motor, a linear guide, a ball screw mechanism, a solenoid or an air cylinder.

The locking member 162 is a bar-like member made of metal and extending in the X direction, and has such a cross-sectional shape as to be fit into the cut parts 161d, 161e of the arms 161a, 161b. When the lid member 13 moves to the position for closing the opening 121, the cut parts 161d, 161e of the arms 161a, 161b are moved up to positions just right below the locking member 162. In other words, the arrangement of the locking member 162 is determined in correspondence with lengths of the arms 161a, 161b and the positions of the cut parts 161d, 161e to achieve such a positional relationship described above.

If the locking member 162 is lowered in this state, both ends in the X direction of the locking member 162 are respectively engaged with the cut parts 161d, 161e. As a result, a rectangular annular structure configured by the arm member 161 and the locking member 162 is arranged to surround the entire outer periphery of the processing chamber 12.

A displacement of the locking member 162 in the (−Y) direction is restricted by the contact of the locking member 162 with the side surface of the cut part 123 of the processing chamber 12. Accordingly, displacements of the arm member 161 and the lid member 13 mounted on the arm member 161 in the (−Y) direction are also restricted. As just described, the lid member 13 is sandwiched between the processing chamber 12 and the arm member 161 and a displacement of the arm member 161 is restricted by the locking member 162, thereby maintaining a state where the lid member 13 closes the opening 121. In this way, the arm member 161 and the locking member 162 function as the lock mechanism 16 for firmly locking the lid member 13.

This locked state is realized by the mechanical engagement of the respective members and is not realized by an active mechanism such as a motor, an air cylinder or a clutch. Accordingly, power is not necessary to maintain the locked state. Further, a force for pushing out the lid member 13 by the internal pressure of the processing space SP acts in a direction to strengthen the engagement of the arm member 161 and the locking member 162. In this sense, the lock mechanism 16 of this embodiment has an interlock function of being able to function only in a state where the internal space is sealed and maintain the locked state without depending on a drive force as long as the members are not mechanically destroyed.

The advancing/retreating mechanism 53 moves the lid member 13 between a "separated position" shown in FIG. 4 and a "closed position" shown in FIG. 5 via the arm member 161. An upper part of FIG. 4 is a plan view showing the separated position of the lid member 13, and a lower part thereof is a side view showing the separated position of the lid member 13. When the lid member 13 is positioned at the separated position shown in FIG. 4, the support tray 15 carrying the substrate S is entirely exposed in a gap space GS between the lid member 13 and the processing chamber 12 and the substrate S can be loaded and unloaded by the transfer unit 30.

At this time, the cut parts 161d, 161e of the arms 161a, 161b are located more toward the (+Y) side than the positions of the gap space GS and the opening 121 of the processing chamber 12. In other words, the positions of the cut parts 161d, 161e are so determined that the cut parts 161d, 161e are located more toward the (+Y) side than the opening 121 of the processing chamber 12 with the lid member 13 located at the separated position. Thus, the lengths of the arms 161a, 161b are so set that the tips of the arms 161a, 161b extend toward the (+Y) side beyond the gap space GS when the lid member 13 is at the separated position.

The advancing/retreating mechanism 53 moves the arm member 161 in the (+Y) direction, whereby the arm member 161, the lid member 13 and the support tray 15 integrally move in the (+Y) direction. In this way, the lid member 13 moves from the separated position (FIG. 4) toward the closed position (FIG. 5). An upper part of FIG. 5 is a plan view showing the closed position of the lid member 13, and a lower part thereof is a side view showing the closed position of the lid member 13.

At the closed position, the lid member 13 closes the opening 121 of the processing chamber 12 via the seal member 122. At this time, the cut parts 161d, 161e of the arms 161a, 161b have reached disposed positions of the cut part 123 of the processing chamber 12 and the locking member 162. By the descent of the locking member 162, the arm member 161, the processing chamber 12 and the locking member 162 are integrally engaged. In this way, a locking action for the lid member 13 functions.

As is understood from the above, in the process of moving the lid member 13 between the separated position and the closed position, the cut parts 161d, 161e of the arms 161a, 161b are constantly located more on the (+Y) side than the opening 121 of the processing chamber 12, i.e. at positions separated in the (+Y) direction from the gap space GS serving as a path in loading/unloading the substrate S. This is advantageous in preventing the contamination of the substrate S being loaded/unloaded. The reason for that is as follows.

In a processing container in which an internal space is brought to a high pressure, an interlock mechanism for preventing the detachment of a lid due to an internal pressure is necessary. To realize that, it is required to firmly mechanically engage robust members. Then, rubbing between the members unavoidably occurs, and the scattering of dust generated due to this rubbing, i.e. fine particles produced by scraping surfaces of the members, possibly occurs.

When such dust is generated near the opening 121 through which the substrate S passes or the gap space GS serving as a conveyance path for the substrate S, the fine particles possibly adhere to the substrate S being conveyed or in the processing space SP. This becomes a cause inducing the contamination of the substrate S by particles.

In this embodiment, the cut parts 161d, 161e provided near the tips of the arms 161a, 161b extending in the Y direction are engaged with the locking member 162, thereby acting as the interlock mechanism. The engaged positions of the arms 161a, 161b with the locking member 162 at that time are largely separated from the opening 121 of the processing chamber 12. That is, rubbing between the members possibly causing dust generation occurs at the positions largely separated from the substrate S.

Further, even if the produced fine particles adhere to or around the cut parts 161a, 161b, the entrance of the fine particles into the gap space GS according to a movement of the arm member 161 can also be prevented. This is because the cut parts 161d, 161e are located more toward the (+Y) side than the gap space GS even at the separated position of the lid member 13 where the cut parts 161d, 161e are located most on the (−Y) side.

Specifically, while the lid member 13 is moving between the separated position and the closed position, the cut parts 161d, 161e, to which the fine particles are possibly adhering, do not pass through a space serving as the gap space GS at the separated position. A downflow formed around the processing unit 10 by the FFU 40 also has an effect of moving the fine particles away from the gap space GS.

Thus, in loading and unloading the substrate S, the substrate S can be passed without being touched by the fine particles produced by the rubbing of the members in the lock mechanism 16. In this way, the contamination of the substrate S due to dust generation can be prevented.

Further, in this embodiment, the pair of arms 161a, 161b are provided across the gap space GS and the processing chamber 12 in a horizontal direction. Merely in terms of the lock mechanism, the lock mechanism functions even if including only one arm. However, by providing the arms respectively on both sides across the lid member 13 and the processing chamber 12, the interlock function can be made more reliable. In this case, by arranging two arms at positions horizontally separated from the gap space GS, the entrance of the fine particle falling down from the arms into the gap space GS can be prevented.

In this embodiment, the arm member 161 and the lid member 13 are joined, and the arms 161a, 161b are structured to extend from the side of the lid member 13 toward the side of the processing chamber 12. However, even if arms are, on the contrary, structured to extend from the side of the processing chamber 12 toward the side of the lid member 13, such a structure is technically equivalent. However, the following problem possibly occurs.

Figure 6A:
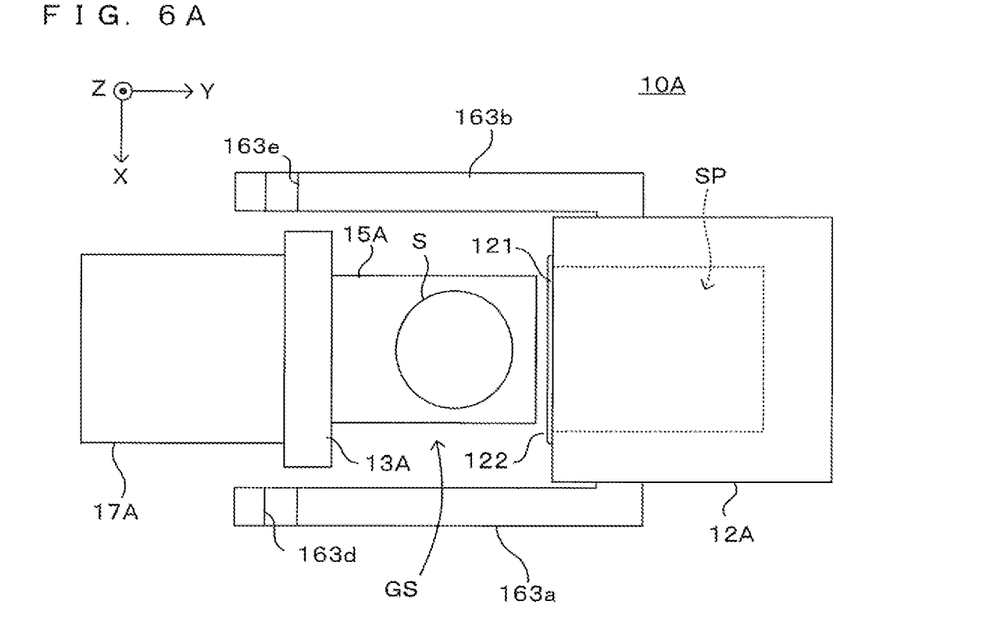
FIG. 6A is a top view showing a modification of the lock mechanism.
Figure 6B:
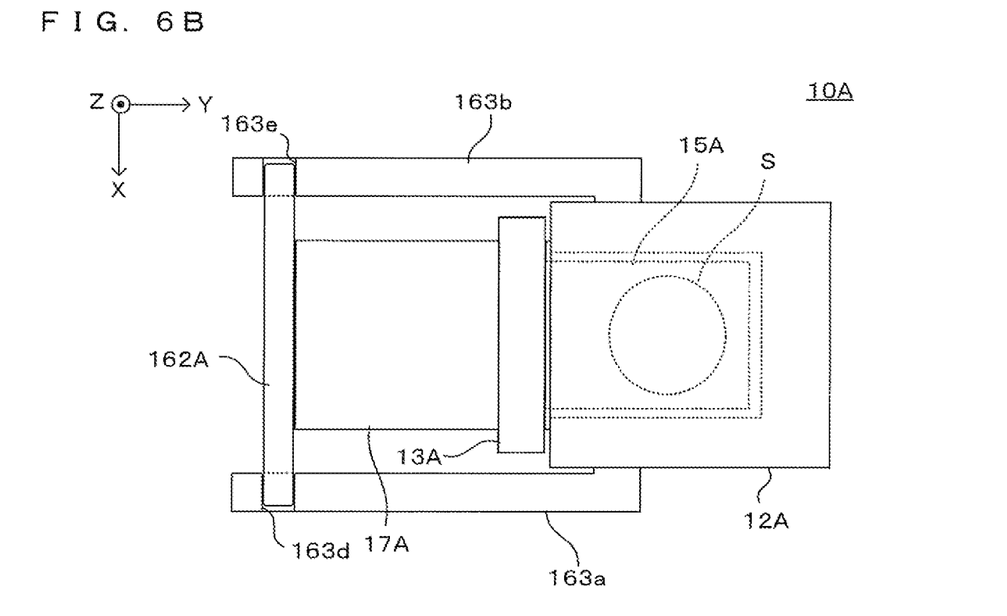
FIG. 6B is a top view showing a modification of the lock mechanism.

FIGS. 6A and 6B are top views showing a modification of the lock mechanism. More specifically, FIG. 6A is a view showing a separated position in a processing unit 10A of this modification and FIG. 6B is a view showing a closed position. In the processing unit 10A of this modification, a pair of arms 163a, 163b extend in the (−Y) direction, i.e. in a direction toward a lid member 13A, from both end parts in the X direction of a processing chamber 12A. The mounting of a support tray 15A for supporting a substrate S on a (+Y) side end surface of the lid member 13A is the same as in the above embodiment. The same components as in the above embodiment are denoted by the same reference signs and the description thereof is omitted.

Then, if an attempt is made to configure an interlock mechanism satisfying a condition that cut parts 163d, 163e on arm tips are located more on the (−Y) side than a gap space GS at the separated position shown in FIG. 6A and a locking member 162A is engaged with the cut parts 163d, 163e at the closed position shown in FIG. 6B, the locking member 162A needs to be arranged at a position largely separated in the (−Y) direction from the lid member 13A as shown in FIG. 6B. Thus, measures such as the mounting of a large extended member 17A on the (−Y) side of the lid member 13A are necessary, which are disadvantageous in terms of apparatus cost and large footprint.

In the above embodiment, on the contrary, the arms 161a, 161b are structured to extend from the side of the lid member 13 toward the side of the processing chamber 12A inevitably having a large depth (length in the Y direction) by enclosing the processing space SP for receiving the substrate S. This structure is advantageous in being able to suppress a footprint increase of the apparatus.

Figure 7A:
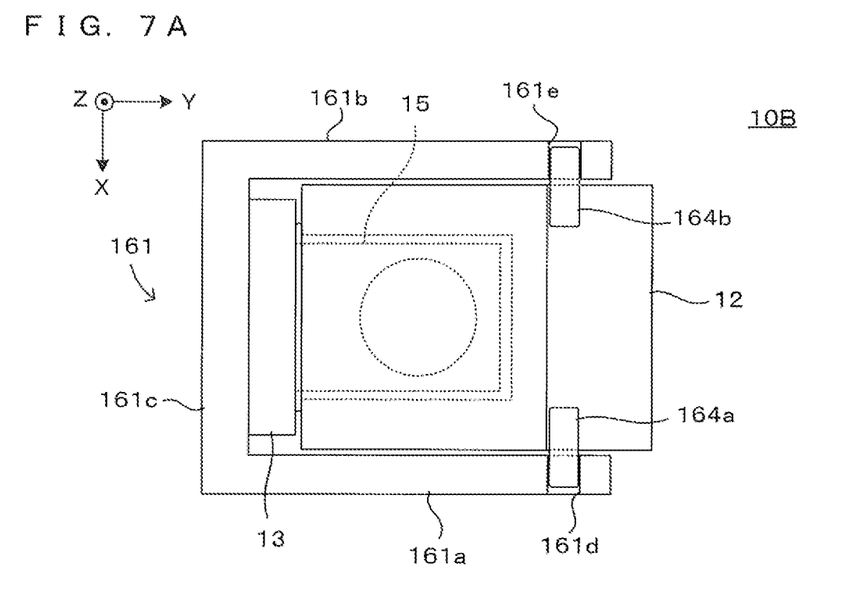
FIG. 7A is a view showing other modifications of the lock mechanism.
Figure 7B:
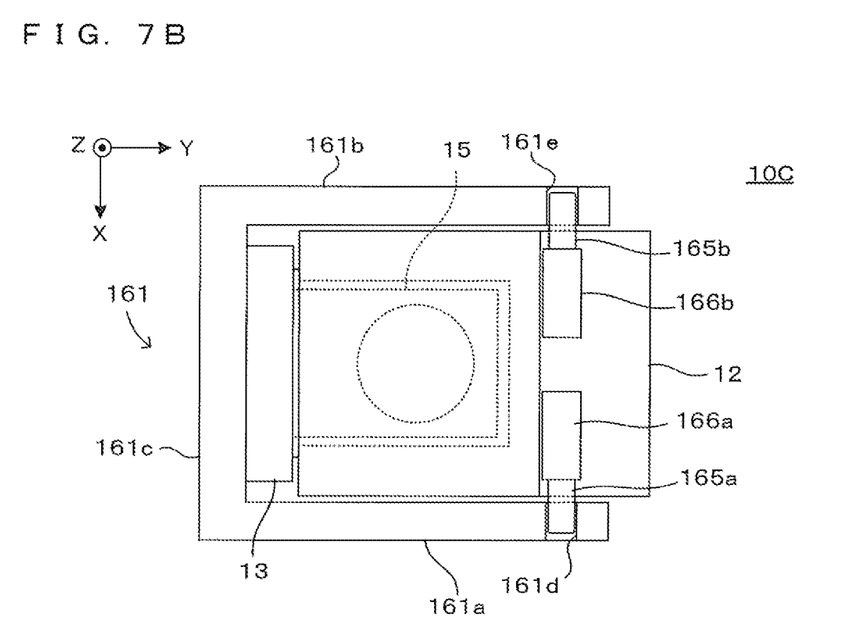
FIG. 7B is a view showing other modifications of the lock mechanism.

FIGS. 7A and 7B are views showing other modifications of the lock mechanism. In these modifications, the structure of a locking member constituting the lock mechanism is different from that of the above embodiment. However, components other than that can be basically the same as those in the above embodiment. Accordingly, the same or substantially same components as those of the above embodiment are denoted by the same reference signs and are not described in detail. Further, these modifications relate to the processing unit 10 and the other components are not described since there is no particular change from the above embodiment.

In a processing unit 10B of the modification shown in FIG. 7A, a pair of locking members 164a, 164b respectively corresponding to cut parts 161d, 161e of two arms 161a, 161b are provided movably upward and downward instead of the locking member 162 configured as an integral member in the above embodiment. Further, in a processing unit 10C of the modification shown in FIG. 7B, a pair of locking members 165a, 165b are respectively driven to advance and retreat in the X direction by appropriate drive mechanisms 166a, 166b such as motors, air cylinders or solenoids.

In these configurations, the arms 161a, 161b may be provided with through holes, into which the locking members are inserted, instead of the cut parts 161d, 161e. As shown in these modifications, functions and effects similar to those of the above embodiment can be obtained by applying various structures as the structure of the lock mechanism 16.

As described above, in the above embodiment, particularly the processing unit 10, out of the substrate processing system 1, corresponds to a "substrate processing apparatus" and "substrate processing system" of the invention. The processing chamber 12 corresponds to a "processing container body" of the invention, the lid member 13 corresponds to a "lid" of the invention, and the support tray 15 corresponds to a "substrate holder" of the invention. Further, the support part 14 and the advancing/retreating mechanism 53 integrally functions as a "mover" of the invention.

Further, in the lock mechanism 16, the arm member 161 (particularly arms 161a, 161b) and the locking member 162 respectively function as an "arm member" and a "locking member" of the invention. Further, in the above embodiment, the transfer unit 30 functions as a "conveyor" of the invention, and the fan filter unit 40 functions as an "air supplier" of the invention. Further, the processing space SP corresponds to an "internal space" of the invention.

Note that the invention is not limited to the above embodiment and various changes other than the aforementioned ones can be made without departing from the gist of the invention. For example, although the substrate S is loaded into and processed in the processing chamber 12 while being held in a horizontal posture in the above embodiment, the posture of the substrate is not limited to this. For example, the substrate may be loaded or unloaded with principal surfaces thereof facing in the horizontal direction.

Further, in the lock mechanism 16 of the above embodiment, the pair of arms 161a, 161b are arranged across the gap space GS, through which the substrate S passes at the time of loading/unloading, in the horizontal direction. However, the number and arrangement of the arms are not limited to these. For example, one, three or more arms may be provided or arm(s) extending downward of a gap space may be provided.

Further, the lock mechanism 16 of the above embodiment is structured to lock the lid member 13 by the engagement of the cut parts 161d, 161e provided in the arms 161a, 161b and the bar-like locking member 162. However, the lock mechanism is not limited to this and various structures for restricting a displacement by mechanical engagement can be employed. For example, the cut parts 161d, 161e provided in the arms 161a, 161b may be formed to face each other in mutually facing surfaces of the both arms instead of being formed in arm upper parts as in the above embodiment. Further, a moving mechanism for fitting the bar-like locking member 162 into the cut parts may be arranged on the side surface of the processing chamber 12 or may be arranged on the upper or lower surface of the processing chamber 12. Further, this moving mechanism may be arranged on the side surface on the (+Y) side of the processing chamber 12.

Further, in the above embodiment, a displacement of the arm member 161 is restricted by the contact of the locking member 162 with the side surface of the processing chamber 12 opposite to the opening 121. However, a locking member may be configured to be supported by a supporting mechanism separate from a processing chamber. Further, although the locking member is locked to the arm member by advancing or retreating in the above embodiment and modifications, the locking member may be switched between an engaged state with the arm member and a released state, for example, by turning or rotating.

Further, in the above embodiment, the lid member 13 and the arm member 161 integrally advance and retreat with respect to the fixed processing chamber 12. However, relative movements of the both can be realized also by a movement of a processing chamber having a lid member fixed thereto. However, the processing chamber is generally larger and heavier than the lid member and various pipes are connected to the processing chamber. From these perspectives, it is thought to be realistic to fix the processing chamber and move the lid member.

Further, the above embodiment relates to the substrate processing system for processing a substrate by a supercritical fluid. However, without limitation to this, the invention can be applied also to various processes performed for substrates in a high-pressure processing container.

As the specific embodiment has been illustrated and described above, the arm member may, for example, extend further outward in a horizontal view than the opening in the substrate processing apparatus according to the invention. According to such a configuration, even if fine particles produced by rubbing fall down from the arm member, the entrance thereof into the gap space is avoided.

Further, for example, a pair of arms may be provided across the gap space and the locking member may be engaged with each of the pair of arms. For example, a single locking member can be structured to be engaged with both of the pair of arms. According to such a configuration, the lid can be reliably prevented from being pushed out by the internal pressure of the internal space and a twisting force can be prevented from acting on the arm member.

Further, for example, the arm member may be combined with the lid and the mover may be configured to move the lid and the arm member integrally. According to such a configuration, the lid can also be reliably locked by locking the arm member.

Further, for example, the opening may be provided in a side surface of the processing container body, a relative moving direction of the lid with respect to the processing container body may be a horizontal direction, and the substrate may be loaded in a horizontal posture into the internal space. Further, for example, a substrate holder for holding the substrate in the horizontal posture may be provided, combined with the lid and configured to be accommodated into the internal space together with the substrate. According to such a configuration, by supporting the substrate in the horizontal posture, it is, for example, possible to receive and process the substrate having a liquid film formed on an upper surface.

In this case, the substrate holder may be configured to be located in the gap space when the lid is at a separated position. According to such a configuration, the substrate can be placed on the substrate holder in the gap space or taken out from the substrate holder.

Further, for example, the substrate processing apparatus according to the invention may include a fluid supplier for supplying a processing fluid in a supercritical state into the internal space. The lock mechanism of the invention is suitable also when the internal space is brought to a high pressure and can be, for example, applied also to a substrate processing using the processing fluid in the supercritical state.

This invention can be applied to substrate processing apparatuses in general for processing a substrate under a high pressure. Particularly, this invention can be suitably applied to a substrate drying process for drying substrates such as semiconductor substrates by a supercritical fluid.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:

1. A substrate processing apparatus, comprising:
    a processing container body which has an internal space capable of accommodating a substrate and an opening provided in a side surface of the processing container body and communicating with the internal space for passage of the substrate;
    a lid which closes the opening;
    a mover which relatively moves the lid with respect to the opening in a horizontal direction to open and close the opening; and
    a lock mechanism which locks the lid to the processing container body, wherein
    the substrate is loaded in a horizontal posture into the internal space,
    the mover changes a relative position of the lid with respect to the processing container body between a closed position and a separated position, the closed position being a position where the lid is proximate to the processing container body and closes the opening and the separated position being a position where the lid is separated from the opening in a direction opposite to the internal space with a gap space between the lid and the opening for allowing passage of the substrate being conveyed into the internal space defined,
    the lock mechanism includes an arm member which is provided on one of the processing container body and the lid and extends outward in the horizontal direction of another one of the processing container body and the lid, and a locking member which restricts a displacement of the arm member by being engaged with the arm member when the lid is at the closed position,
    a tip of the arm member extends toward a side of the another one beyond the gap space when the lid is at the separated position, and
    the locking member is engaged with a part of the arm member, the part being located beyond the gap space when the lid is at the separated position.

2. The substrate processing apparatus according to claim 1, wherein the arm member extends further outward in a horizontal view than the opening.

3. The substrate processing apparatus according to claim 2, wherein a pair of arms of the arm member is provided across the gap space and the locking member is engaged with each of the pair of arms.

4. The substrate processing apparatus according to claim 3, wherein the locking member includes a single locking member which engages with both of the pair of arms.

5. The substrate processing apparatus according to claim 1, wherein the arm member is combined with the lid and the mover moves the lid and the arm member integrally.

6. The substrate processing apparatus according to claim 1, further comprising a substrate holder which is combined with the lid and holds the substrate in the horizontal posture, wherein
   the substrate holder is accommodated into the internal space together with the substrate.

7. The substrate processing apparatus according to claim 6, wherein the substrate holder is located in the gap space when the lid is at the separated position.

8. The substrate processing apparatus according to claim 1, further comprising a fluid supplier which supplies a supercritical processing fluid into the internal space.

9. A substrate processing system, comprising:
   a substrate processing device which has a same structure as the image processing apparatus according to claim 1;
   a conveyer which conveys the substrate to the gap space; and
   an air supplier which is disposed above the gap space and supplies a downflow to the gap space.

* * * * *